(12) United States Patent
Mizusawa

(10) Patent No.: US 10,797,216 B2
(45) Date of Patent: Oct. 6, 2020

(54) PIEZOELECTRIC DEVICE

(71) Applicant: NIHON DEMPA KOGYO CO., LTD., Tokyo (JP)

(72) Inventor: Shuichi Mizusawa, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 457 days.

(21) Appl. No.: 15/862,642

(22) Filed: Jan. 5, 2018

(65) Prior Publication Data
US 2018/0240958 A1    Aug. 23, 2018

(30) Foreign Application Priority Data

Feb. 17, 2017   (JP) ................... 2017-027798

(51) Int. Cl.
| | | |
|---|---|---|
| H01L 41/053 | (2006.01) | |
| H01L 41/09 | (2006.01) | |
| H01L 41/047 | (2006.01) | |
| H03H 9/05 | (2006.01) | |
| H03H 9/17 | (2006.01) | |
| H03H 9/10 | (2006.01) | |
| H03H 9/19 | (2006.01) | |

(52) U.S. Cl.
CPC ...... *H01L 41/0475* (2013.01); *H01L 41/0913* (2013.01); *H03H 9/0509* (2013.01); *H03H 9/0519* (2013.01); *H03H 9/1014* (2013.01); *H03H 9/177* (2013.01); *H03H 9/1021* (2013.01); *H03H 9/19* (2013.01)

(58) Field of Classification Search
CPC ............ H01L 41/0475; H01L 41/0913; H03H 9/0509; H03H 9/0519; H03H 9/1014; H03H 9/177; H03H 9/1021; H03H 9/19

USPC ................. 310/348, 349, 367, 368
See application file for complete search history.

(56) References Cited

U.S. PATENT DOCUMENTS

| | | | | |
|---|---|---|---|---|
| 3,986,061 A | * | 10/1976 | Suzuki ............. | F23Q 2/287 |
| | | | | 310/339 |
| 4,985,655 A | * | 1/1991 | Jensik ............. | H03H 9/0514 |
| | | | | 310/344 |
| 6,362,561 B1 | * | 3/2002 | Kuroda ............ | H03H 9/177 |
| | | | | 310/368 |
| 2006/0175939 A1 | * | 8/2006 | Murata ............ | H03H 9/1021 |
| | | | | 310/368 |

FOREIGN PATENT DOCUMENTS

JP          2012090083          5/2012

* cited by examiner

*Primary Examiner* — Thomas M Dougherty
(74) *Attorney, Agent, or Firm* — JCIPRNET

(57) ABSTRACT

A piezoelectric device includes a piezoelectric vibrating piece, a container, and a lid. The piezoelectric vibrating piece is bevel processed and has a bevel surface at one end of the piezoelectric vibrating piece. Thea container holds the piezoelectric vibrating piece with the bevel surface at the one end of the piezoelectric vibrating piece. The container has a connection pad at a holding region of the container and a pillow portion at a region corresponding to the other end of the piezoelectric vibrating piece. The lid member seals the container. The connection pad is buried in the container at the holding region in a state of a flat surface with a surface of the container and in a state where the surface of the connection pad is exposed. The piezoelectric vibrating piece is spanned between the surface of the connection pad and a top surface of the pillow portion.

4 Claims, 3 Drawing Sheets

PIEZOELECTRIC DEVICE

CROSS-REFERENCE TO RELATED APPLICATIONS

This application is based on and claims priority under 35 U.S.C. § 119 to Japanese Patent Application No. 2017-027798, filed on Feb. 17, 2017, the entire content of which is incorporated herein by reference.

TECHNICAL FIELD

This disclosure relates to a piezoelectric device that is excellent in an impact resistance, easy to ensure low profile, and has a reduced influence of a stray capacity.

DESCRIPTION OF THE RELATED ART

Various pieces of electronic equipment such as a mobile phone and a personal computer often use a piezoelectric device such as a crystal unit or a crystal controlled oscillator for selecting and controlling a frequency, or for similar purpose.

One kind of such a piezoelectric device includes a crystal unit having a configuration that secures a crystal element to a container by supporting its one end, namely, by a cantilever support, and receives the other end of the crystal element with a pillow portion. FIG. 3A, FIG. 3B, and FIG. 3C are explanatory drawings of a crystal unit 10 of this kind. In particular, FIG. 3A is a plan view illustrating the crystal unit 10, FIG. 3B and FIG. 3C are cross-sectional views taken along the line IIIB-IIIB in FIG. 3A, of the crystal unit 10. Note, however, that FIG. 3A illustrates a state where a lid member 17 is removed.

In the crystal unit 10, a crystal element 11 includes excitation electrodes 11a and extraction electrodes 11b on its front and back sides. At its one end, namely, at an extraction electrode 11b side, the crystal element 11 is electrically and mechanically connected and secured to connection pads 13a inside a container 13 with conductive adhesives 15. Moreover, a pillow portion 13b is located at a position that is on a bottom surface of the container 13 and corresponds to the other end of the crystal element 11, and the crystal element 11 is spanned between the connection pads 13a and the pillow portion 13b to be mounted. Then, the container 13 is airtightly sealed by the lid member 17. External connecting terminals 13c are located on the outer bottom surface of the container 13. The external connecting terminal 13c and the connection pad 13a are connected by a via wiring 13d. This kind of crystal unit is disclosed in many prior applications including, for example, Japanese Unexamined Patent Application Publication No. 2012-90083. In Japanese Unexamined Patent Application Publication No. 2012-90083, to enable mounting crystal elements with different plane sizes in an identical kind of container, a plurality of pillow portions that have different heights are arranged with mutual positions shifted on a bottom surface inside the container.

The above-described support structure that is the cantilever support and uses the pillow portion 13b is a preferred structure, since the crystal element 11 can be mounted to the container 13 without causing the crystal element 11 to be brought into contact with the bottom surface of the container 13. However, studies by the inventor according to this application result in the following problem. In a case of the crystal unit 10 with the cantilever support, applying an impact to the crystal unit 10 causes the distal end side of the crystal element 11 to swing with the positions secured by the conductive adhesives 15 as a fulcrum, as illustrated in FIG. 3B and FIG. 3C. Swing of the distal end of the crystal element 11 causes the distal end of the crystal element 11 to be brought into contact with the lid member 17 and the pillow portion 13b to receive an impact. When a gap "gx" between the lid member 17 and the crystal element 11 is large, the above-described impact becomes increasingly larger. This impact causes a breakage of the crystal element 11 or generation of a frequency variation, even when it does not cause a breakage. To avoid this, when the crystal unit 10 is designed such that the gap between the lid member 17 and the crystal element 11 becomes "gy" (see FIG. 3C) smaller than the above-described "gx", then this causes the crystal unit 10 to be susceptible to the influence of the stray capacity, which is generated between the excitation electrode 11a and the lid member 17 and by an external cause, and may cause frequency stability to be degraded.

In association with downsizing of electronic equipment, there is an increasing demand for a low profile relative to the piezoelectric device. In a structure that uses a pillow portion, a design method to meet all the demands for the low profile, the impact resistance, and the stray capacity is profoundly desired.

A need thus exists for a piezoelectric device which is not susceptible to the drawback mentioned above.

SUMMARY

According to an aspect of this disclosure, there is provided a piezoelectric device. The piezoelectric device includes a piezoelectric vibrating piece, a container, and a lid. The piezoelectric vibrating piece is bevel processed. The piezoelectric vibrating piece has a bevel surface at one end of the piezoelectric vibrating piece. The container holds the piezoelectric vibrating piece with the bevel surface at the one end of the piezoelectric vibrating piece. The container has a connection pad at a holding region of the container and a pillow portion at a region corresponding to the other end of the piezoelectric vibrating piece. The lid member seals the container. The connection pad is buried in the container at the holding region in a state of a flat surface with the surface of the container and in a state where the surface of the connection pad is exposed. The piezoelectric vibrating piece is spanned between the surface of the connection pad and a top surface of the pillow portion.

Here, the term of being bevel processed according to the disclosure includes, for example, a case of being processed in a bevel shape by a mechanical lapping or a case of being processed in a bevel shape by a chemical method such as wet etching, which is employed on a case-by-case basis. The term of a surface of a connection pad and a surface of a container being flush with one another means both cases of being truly flush with one another and being substantially flush with one another. For example, the disclosure includes a surface in a state where a slight convex portion with a thickness of several μm is generated on a surface of a connection pad due to application of an electrolytic plating film, as a flat surface.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Figure 1A:
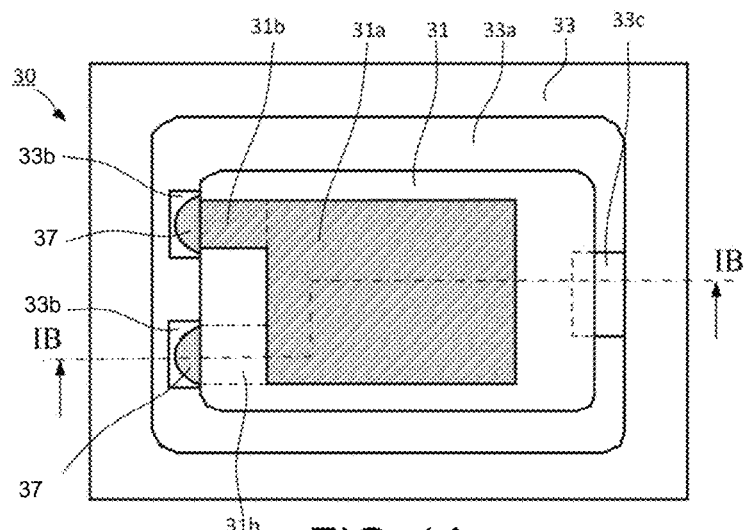
FIG. 1A, FIG. 1B, and FIG. 1C are drawings for describing a piezoelectric device 30 according to a first embodiment.

The following describes embodiments of the disclosure with reference to the drawings. Each drawing used in the description is merely illustrated schematically for understanding this disclosure. In each drawing used in the description, like reference numerals designate corresponding or identical elements, and therefore such elements will not be further elaborated here. Shapes, dimensions, materials, and a similar factor described in the following embodiments are merely preferable examples within the scope of this disclosure. Therefore, this disclosure is not limited to only the following embodiments.

1. First Embodiment

Figure 1B:
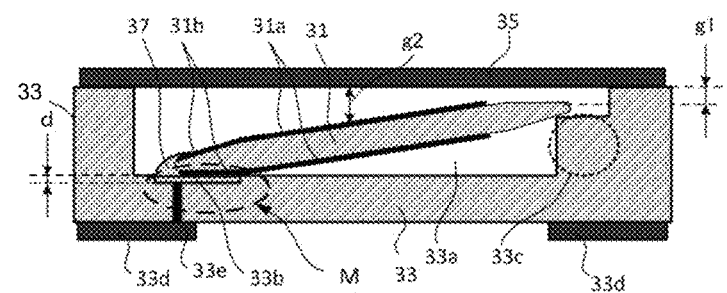
Figure 1C:
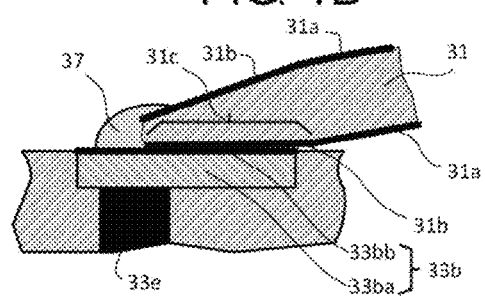

FIG. 1A, FIG. 1B, and FIG. 1C are drawings describing a piezoelectric device 30 according to a first embodiment. In particular, FIG. 1A is a plan view illustrating the piezoelectric device 30, FIG. 1B is a cross-sectional view taken along the line IB-IB in FIG. 1A, and FIG. 1C is an enlarged figure of a portion "M" in FIG. 1B.

The piezoelectric device 30 according to the first embodiment includes: a piezoelectric vibrating piece 31, a container 33 that contains the piezoelectric vibrating piece 31, and a lid member 35 that seals the container 33.

The piezoelectric vibrating piece 31 is, for example, an AT-cut crystal unit having a rectangular shape as a planar shape. The piezoelectric vibrating piece 31 includes: excitation electrodes 31a on each of its front and back surfaces, and extraction electrodes 31b extracted from the excitation electrodes 31a to one end of the piezoelectric vibrating piece 31. The piezoelectric vibrating piece 31 is bevel processed. That is, an edge region of the piezoelectric vibrating piece 31 is processed in a shape inclining from a center side of the piezoelectric vibrating piece 31 toward its end. In FIG. 1C, a portion to which reference numeral 31c is attached corresponds to one of bevel surfaces. Such bevel processing can be performed, for example, in a method such as the following: put an approximately rectangular-shaped piezoelectric vibrating piece, which is in a state before being bevel processed, into a cylindrically-shaped lapping tube with an abrasive and then rotate the lapping tube to process the edge of the piezoelectric vibrating piece; or process the piezoelectric vibrating piece by a photolithography technique and a wet etching technique to form an inclined surface on the edge.

The container 33, in the case of this example, includes a depressed portion 33a that contains the piezoelectric vibrating piece 31. This container 33 can be configured by, for example, a ceramic-made container. The container 33 includes connection pads 33b in a region that is a partial region of its bottom plate and holds the bevel surface of the piezoelectric vibrating piece 31, and a pillow portion 33c in a region that corresponds to the other end of the piezoelectric vibrating piece 31. However, the connection pads 33b have a structure different from a conventional connection pad. That is, the connection pads 33b are buried in the bottom plate of the container 33 in a state where the connection pads 33b are flush with a bottom surface of the depressed portion 33a of the container 33 and front surfaces of the connection pads 33b are exposed. More specifically, the connection pad 33b has a two-layer structure of a metal film 33ba buried in the bottom plate of the container 33 and a plating film 33bb plated on a surface of the metal film 33ba. The metal film 33ba can be configured by sintering a conductive paste including, for example, molybdenum powders or tungsten powders, which are, for example, high-melting-point metal powders, and the plating film 33bb can be configured of a plating film of, for example, nickel and gold. A specific method to bury the connection pad 33b in the container 33 can include, for example, the following: print a paste for forming the metal film 33ba on a green sheet for fabricating a ceramic-made container, then after preliminarily firing the paste, apply pressure to bury a portion that corresponds to the metal film 33ba in the green sheet, and subsequently, finally fire the portion together with the green sheet; or similar method.

The plating film 33bb is formed on the surface of the metal film 33ba, which has been formed as described above, by electroplating. Obviously, the plating film 33bb may be formed by electroless plating. While the buried metal film 33ba has a thickness (indicated by "d" in FIG. 1B) of, for example, several 10 μm, the plating film 33bb has a thickness of, at most, several μm. Thus, the connection pads 33b become a state of being substantially buried in the bottom plate of the container 33, and the surfaces of the connection pads 33b and the bottom-plate surface of the container 33 become a state of the flat surface.

Figure 3A:
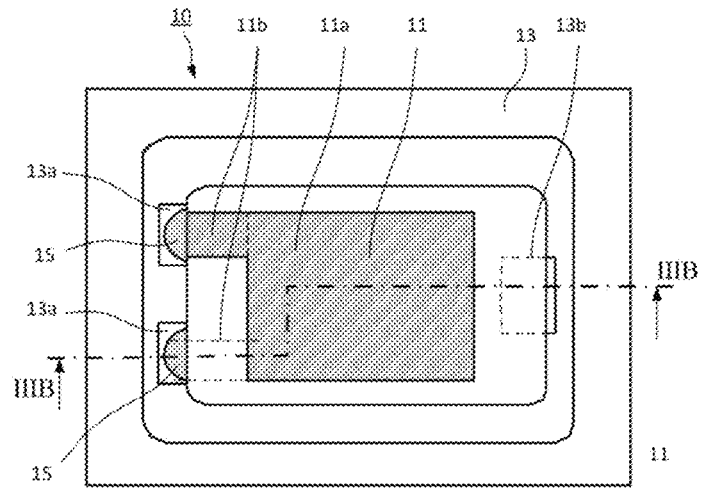
FIG. 3A, FIG. 3B, and FIG. 3C are drawings describing a conventional technique and its problem.
Figure 3B:
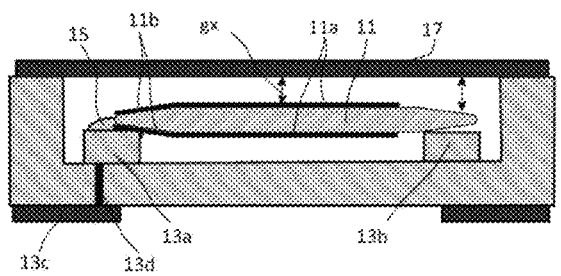
Figure 3C:
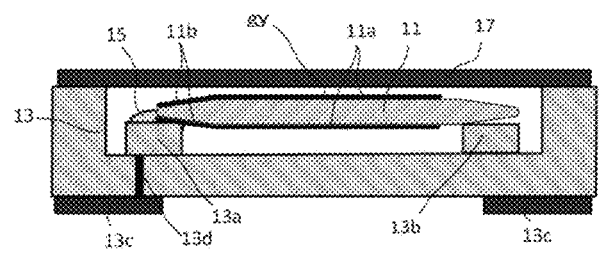

The pillow portion 33c serves to incline the piezoelectric vibrating piece 31 such that the distal end side of the piezoelectric vibrating piece 31 becomes high. It is preferred that the pillow portion 33c has a height that not only causes the piezoelectric vibrating piece 31 to be inclined but also causes the piezoelectric vibrating piece 31 to be inclined such that a bevel surface 31c of the piezoelectric vibrating piece 31 becomes substantially parallel with the surfaces of the connection pads 33b. This easily ensures a fixed area and ensures contribution to improvement of the impact resistance because the bevel surface 31c of the piezoelectric vibrating piece 31 directly faces to the connection pads 33b in the container 33 to be in close contact. While the pillow portion 33c illustrated in FIG. 1B is located in a state of being in contact with a side wall of the container 33, the pillow portion 33c may be located separated from the side wall of the container 33, as the example illustrated in FIG. 3A, FIG. 3B, and FIG. 3C.

An outside bottom surface of the container 33 includes external terminals 33d for connecting the piezoelectric device 30 to any external electronic equipment. The external terminal 33d and the connection pad 33b are electrically connected via a via wiring 33e located on the bottom plate of the container 33.

For such container 33, the piezoelectric vibrating piece 31 is placed such that the bevel surface 31c of the piezoelectric vibrating piece 31 is positioned on the connection pads 33b and the distal end of the piezoelectric vibrating piece 31 is positioned on the pillow portion 33c, and is connected and secured at the positions of the connection pads 33b by the conductive adhesives 37. Then, the container 33 is sealed by the lid member 35.

In the piezoelectric device 30, the piezoelectric vibrating piece 31 is secured to the connection pads 33b of the container 33 with the bevel surface 31c of the one end of the piezoelectric vibrating piece 31, and the distal end of the piezoelectric vibrating piece 31 is spanned over the pillow portion 33c. Therefore, since the piezoelectric vibrating piece 31 is firmly secured to the container 33 and is in a state of being inclined, denoting a gap between the top surface of the pillow portion 33c and the inner surface of the lid member 35 as "g1" and denoting a gap between a central surface of the piezoelectric vibrating piece 31 in a direction from the one end toward the other end of the piezoelectric vibrating piece 31 and the inner surface of the lid member 35 as "g2", result in g2>g1. In view of this, this ensures improvement of the impact resistance even when the piezoelectric device 30 receives an impact because the piezoelectric vibrating piece 31 is firmly secured and the swing of the distal end of the piezoelectric vibrating piece 31 can be decreased. Further, this ensures a reduced influence of the stray capacity because the gap "g2", which is a gap between the lid member 35 and the excitation electrode 31a of the piezoelectric vibrating piece 31, is increased by the inclination of the piezoelectric vibrating piece 31. Furthermore, this ensures the low profile of the piezoelectric device 30 because the connection pads 33b are buried in the container 33 in a predetermined relationship.

2. Another Embodiment

Figure 2:
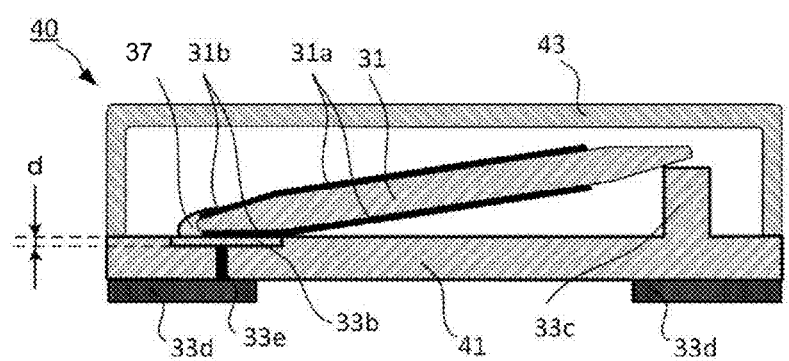
FIG. 2 is an explanatory drawing of the piezoelectric device according to another embodiment.

The piezoelectric device 30 according to the first embodiment has a configuration where the container 33 has the depressed portion 33a housing the piezoelectric vibrating piece 31. However, a container is not limited to one having a depressed portion. FIG. 2 is a drawing describing the example, and is an explanatory drawing of a piezoelectric device 40 according to another embodiment illustrated in a cross-sectional view corresponding to FIG. 1B.

The piezoelectric device 40 uses a plate-shaped container 41 as a container and a cap-shaped lid member 43 as a lid member. The plate-shaped container 41 includes the connection pads 33b, the pillow portion 33c, the external terminals 33d, and the via wirings 33e, which are the components similar to the piezoelectric device 30 according to the first embodiment. The cap-shaped lid member 43 has a depressed portion that contains the piezoelectric vibrating piece 31. The disclosure can be applied to such configuration and can obtain similar effects.

While the above-described example illustrates the crystal unit as the piezoelectric device, the disclosure can be applied also to a crystal controlled oscillator. While the AT-cut crystal element is illustrated as the piezoelectric vibrating piece, a crystal element with another cut, for example, a twice rotated crystal element such as an SC cut crystal unit may be employed. Further, the disclosure can be applied also to a piezoelectric resonator that uses a piezoelectric material other than crystal and a piezoelectric oscillator.

With the piezoelectric device according to the embodiment, a piezoelectric vibrating piece is secured to the container at the positions of the connection pads in a state where the piezoelectric vibrating piece is spanned between the surfaces of the connection pads, which are buried in the container, and a top surface of a pillow portion. Here, burying the connection pads reduces the influence of the height of the connection pads compared to when the connection pads are individually formed on the bottom surface of the container like a conventional manner, and thus this easily ensures the low profile of the piezoelectric device. The surfaces of the connection pads and the surface of the container are flush with one another, and a bevel surface of the piezoelectric vibrating piece is secured to this flush, continuous surface; and thus this ensures improvement of the impact resistance because an adhesion strength between the surfaces of the connection pads and the bevel surface of the piezoelectric vibrating piece is expected to be improved compared with a case of not being secured to the flush, continuous surface. Because the piezoelectric vibrating piece is mounted inside the container in a state where the piezoelectric vibrating piece is inclined with the height of the pillow portion side higher, a gap between an excitation electrode of the piezoelectric vibrating piece and an inner surface of a lid member becomes wider compared with a case where the piezoelectric vibrating piece is not inclined. This ensures that the piezoelectric vibrating piece is less susceptible to an influence of a stray capacity.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device, comprising:
a piezoelectric vibrating piece that is bevel processed, the piezoelectric vibrating piece having a bevel surface at one end of the piezoelectric vibrating piece;
a container that holds the piezoelectric vibrating piece with the bevel surface at the one end of the piezoelectric vibrating piece, the container having a connection pad at a holding region of the container and a pillow portion at a region corresponding to the other end of the piezoelectric vibrating piece; and
a lid member that seals the container, wherein
the connection pad is buried in the container at the holding region in a state of a flat surface with a surface of the container and in a state where the surface of the connection pad is exposed, and
the piezoelectric vibrating piece is spanned between the surface of the connection pad and a top surface of the pillow portion.

2. The piezoelectric device according to claim 1, wherein the connection pad is a laminated film configured of a metal-paste sintered body and a plating film plated on the metal-paste sintered body.

3. The piezoelectric device according to claim 1, wherein the pillow portion has a height that is determined such that the bevel surface and the surface of the connection pad are parallel with one another.

4. The piezoelectric device according to claim 1, wherein denoting a gap between the top surface of the pillow portion and an inner surface of the lid member as g1, and
denoting a gap between a central surface of the piezoelectric vibrating piece in a direction from the one end toward the other end of the piezoelectric vibrating piece and the inner surface of the lid member as g2,
result in g2>g1.

* * * * *